United States Patent
Jeon

(10) Patent No.: US 12,025,668 B2
(45) Date of Patent: Jul. 2, 2024

(54) BATTERY DIAGNOSING SYSTEM AND METHOD

(71) Applicant: LG ENERGY SOLUTION, LTD., Seoul (KR)

(72) Inventor: Young-Hwan Jeon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/265,624

(22) PCT Filed: Aug. 29, 2022

(86) PCT No.: PCT/KR2022/012882
§ 371 (c)(1),
(2) Date: Jun. 6, 2023

(87) PCT Pub. No.: WO2023/033480
PCT Pub. Date: Mar. 9, 2023

(65) Prior Publication Data
US 2024/0027531 A1    Jan. 25, 2024

(30) Foreign Application Priority Data
Aug. 31, 2021 (KR) .................. 10-2021-0115865

(51) Int. Cl.
*G01R 31/367* (2019.01)
(52) U.S. Cl.
CPC ................................. *G01R 31/367* (2019.01)
(58) Field of Classification Search
CPC .................................................. G01R 31/367
See application file for complete search history.

(56) References Cited

U.S. PATENT DOCUMENTS 6,259,254 B1 * 7/2001 Klang ................... H02J 7/0071
324/427
2003/0184307 A1   10/2003 Kozlowski et al.
(Continued)

FOREIGN PATENT DOCUMENTS

CN        204821189 U      12/2015
CN        105955146 A       9/2016
(Continued)

OTHER PUBLICATIONS

International Search Report for PCT/KR2022/012882 dated Dec. 23, 2022.
(Continued)

*Primary Examiner* — Tung S Lau
(74) *Attorney, Agent, or Firm* — Birch, Stewart, Kolasch & Birch, LLP

(57) ABSTRACT

Discussed is a battery diagnosing system that may include a battery management system (BMS) configured to obtain battery information including at least one of a temperature, a current and a voltage of a battery, and generate a first diagnosis result corresponding to a current state of the battery based on the battery information; and a server configured to receive the battery information and the first diagnosis result from the BMS, generate a second diagnosis result corresponding to the current state of the battery and a third diagnosis result corresponding to a future state of the battery from the battery information based on a state estimation model, which is pre-trained, and determine the current state of the battery based on a plurality of diagnosis results of the first diagnosis result, the second diagnosis result and the third diagnosis result.

20 Claims, 6 Drawing Sheets

(56) References Cited

U.S. PATENT DOCUMENTS

| | | | |
|---|---|---|---|
| 2007/0236181 A1* | 10/2007 | Palladino | G01R 31/379 320/130 |
| 2013/0091083 A1 | 4/2013 | Frisch et al. | |
| 2016/0018472 A1 | 1/2016 | Sung et al. | |
| 2016/0161567 A1 | 6/2016 | Park | |
| 2018/0143257 A1 | 5/2018 | Garcia et al. | |
| 2020/0271726 A1 | 8/2020 | Hening et al. | |
| 2020/0278398 A1 | 9/2020 | Isa et al. | |
| 2022/0170988 A1 | 6/2022 | Jeon | |

FOREIGN PATENT DOCUMENTS

| | | | |
|---|---|---|---|
| CN | 110058178 A | 7/2019 | |
| CN | 111007401 A * | 4/2020 | G01R 31/367 |
| EP | 2 581 754 A2 | 4/2013 | |
| KR | 10-2016-0067510 A | 6/2016 | |
| KR | 10-2018-0100016 A | 9/2018 | |
| KR | 10-1897038 B1 | 9/2018 | |
| KR | 10-2035675 B1 | 10/2019 | |
| KR | 10-2019-0125906 A | 11/2019 | |
| KR | 10-2020-0053522 A | 5/2020 | |
| KR | 10-2020-0078129 A | 7/2020 | |
| KR | 10-2021-0024962 A | 3/2021 | |
| KR | 10-2221756 B1 | 3/2021 | |
| KR | 10-2021-0040721 A | 4/2021 | |
| KR | 10-2258643 B1 | 6/2021 | |
| WO | WO 2021/040238 A1 | 3/2021 | |

OTHER PUBLICATIONS

Supplementary European Search Report for European Application No. 22864962.8, dated May 8, 2024.

* cited by examiner

FIG. 3

|  | FIRST DIAGNOSIS RESULT | SECOND DIAGNOSIS RESULT | THIRD DIAGNOSIS RESULT | DETERMINATION RULE CORRESPONDING TO DIAGNOSIS RESULT |
|---|---|---|---|---|
| FIRST EMBODIMENT | A | A | A | FIRST DETERMINATION RULE |
| SECOND EMBODIMENT | A | B | B | SECOND DETERMINATION RULE |
| THIRD EMBODIMENT | A | A | B | THIRD DETERMINATION RULE |
| FOURTH EMBODIMENT | A | B | A | FOURTH TO SIXTH DETERMINATION RULES |
| FIFTH EMBODIMENT | A | B | C | |

FIG. 4

| DETERMINATION RULE | CONTENT |
|---|---|
| FIRST DETERMINATION RULE | DETERMINE ANY ONE OF FIRST DIAGNOSIS RESULT, SECOND DIAGNOSIS RESULT AND THIRD DIAGNOSIS RESULT AS CURRENT STATE OF BATTERY |
| SECOND DETERMINATION RULE | RE-RECEIVE FIRST DIAGNOSIS RESULT AND DETERMINE CURRENT STATE OF BATTERY AS LEVEL WITH HIGH RISK AMONG RE-RECEIVED FIRST DIAGNOSIS RESULT, SECOND DIAGNOSIS RESULT AND THIRD DIAGNOSIS RESULT |
| THIRD DETERMINATION RULE | DTERMINE CURRENT STATE OF BATTERY AS LEVEL WITH HIGH RISK AMONG FIRST DIAGNOSIS RESULT, SECOND DIAGNOSIS RESULT AND THIRD DIAGNOSIS RESULT |
| FOURTH DETERMINATION RULE | RETRAIN STATE ESTIMATION MODEL, REGENERATE SECOND DIAGNOSIS RESULT AND THIRD DIAGNOSIS RESULT, AND DETERMINE CURRENT STATE OF BATTERY BASED ON FIRST DIAGNOSIS RESULT, REGENERATED SECOND DIAGNOSIS RESULT AND REGENERATED THIRD DIAGNOSIS RESULT |
| FIFTH DETERMINATION RULE | AS FOLLOW-UP RULE OF FOURTH DETERMINATION RULE, WHEN FIRST DIAGNOSIS RESULT AND REGENERATED SECOND DIAGNOSIS RESULT ARE THE SAME AND REGENERATED SECOND DIAGNOSIS RESULT AND REGENERATED THIRD DIAGNOSIS RESULT ARE DIFFERENT, OUTPUT ALARM ABOUT ERROR OF STATE ESTIMATION MODEL |
| SIXTH DETERMINATION RULE | AS FOLLOW-UP RULE OF FOURTH DETERMINATION RULE, WHEN FIRST DIAGNOSIS RESULT, REGENERATED SECOND DIAGNOSIS RESULT AND REGENERATED THIRD DIAGNOSIS RESULT ARE ALL DIFFERENT, RETRAIN STATE ESTIMATION MODEL, REGENERATE SECOND DIAGNOSIS RESULT AND THIRD DIAGNOSIS RESULT, AND DETERMINE CURRENT STATE OF BATTERY BASED ON FIRST DIAGNOSIS RESULT, REGENERATED SECOND DIAGNOSIS RESULT AND REGENERATED THIRD DIAGNOSIS RESULT |

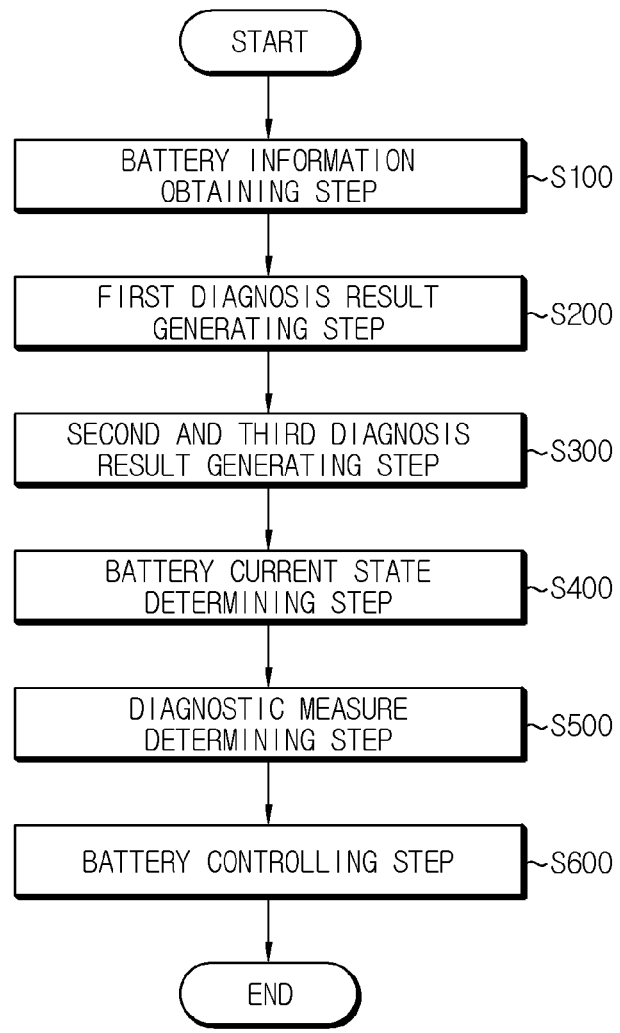

BATTERY DIAGNOSING SYSTEM AND METHOD

TECHNICAL FIELD

The present application claims priority to Korean Patent Application No. 10-2021-0115865 filed on Aug. 31, 2021 in the Republic of Korea, the disclosures of which are incorporated herein by reference.

The present disclosure relates to a battery diagnosing system and method, and more particularly, to a battery diagnosing system and method for determining a current state of a battery based on a diagnosis result in a battery management system (BMS) and a server.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Temperature, voltage, and current are representative examples of battery information capable of diagnosing the state of the battery, and the state of the battery may be diagnosed based on the battery information. It is desirable to periodically diagnose the state of the battery because it is possible to judge whether the battery is abnormal or estimate the lifespan of the battery through the battery state diagnosis.

DISCLOSURE

Technical Problem

The present disclosure is designed to solve the problems of the related art, and therefore the present disclosure is directed to providing a battery diagnosing system and method, which may determine a current state of a battery based on a plurality of diagnosis results in a BMS and a server, and properly control the battery based on the determined current state.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing system according to one aspect of the present disclosure may include: a battery management system (BMS) configured to obtain battery information including at least one of a temperature, a current and a voltage of a battery, and generate a first diagnosis result corresponding to a current state of the battery based on the battery information; and a server configured to: receive the battery information and the first diagnosis result from the BMS, generate a second diagnosis result corresponding to the current state of the battery and a third diagnosis result corresponding to a future state of the battery from the battery information based on a state estimation model, which is pre-trained, and determine the current state of the battery based on a plurality of diagnosis results of the first diagnosis result, the second diagnosis result, and the third diagnosis result.

The plurality of diagnosis results may be configured to be classified into a first level, a second level, and a third level in order of risk for the battery.

The server may be configured to determine the current state according to a comparison result for the plurality of diagnosis results based on a preset battery state determination rule.

The server may be configured to judge whether the plurality of diagnosis results are the same and determine the current state of the battery based on a judgment result and the preset battery state determination rule.

When the plurality of diagnosis results are the same, the server may be configured to determine the current state of the battery to correspond to any one of the plurality of diagnosis results.

When the first diagnosis result and the second diagnosis result are different and the second diagnosis result and the third diagnosis result are the same, the server may be configured to re-receive the first diagnosis result from the BMS for a predetermined time and determine the current state of the battery based on the re-received first diagnosis result, the second diagnosis result and the third diagnosis result.

The server may be configured to determine the level with a highest risk among the re-received first diagnosis result, the second diagnosis result and the third diagnosis result as the current state of the battery.

When the first diagnosis result and the second diagnosis result are the same and the second diagnosis result and the third diagnosis result are different, the server may be configured to determine the level with a highest risk among the plurality of diagnosis results as the current state of the battery.

When the first diagnosis result and the third diagnosis result are the same and the third diagnosis result and the second diagnosis result are different, and when the plurality of diagnosis results are all different, the server may be configured to retrain the state estimation model based on the battery information received from the BMS and accumulatively stored, regenerate the second diagnosis result and the third diagnosis result for the battery using the retrained state estimation model, and diagnose the current state of the battery based on the first diagnosis result, the regenerated second diagnosis result, and the regenerated third diagnosis result.

When the first diagnosis result and the regenerated second diagnosis result are the same and the regenerated third diagnosis result and the regenerated second diagnosis result are different, the server may be configured not to determine the current state of the battery and to output a notification that an error occurs in the state estimation model.

When the first diagnosis result, the regenerated second diagnosis result, and the regenerated third diagnosis result are all different, the server may be configured to retrain the state estimation model.

The server may be configured to determine a diagnostic measure for the battery to correspond to the determined current state of the battery, and transmit the determined diagnostic measure to the BMS.

The BMS may be configured to control the battery according to the diagnostic measure received from the server.

The server may be configured to: determine a fire occurrence level as the state current state of the battery based on the plurality of diagnosis results, and determine any one of current blocking of the battery, cooling operation for the battery, and fire suppression for the battery as a diagnostic measure corresponding to the determined fire occurrence level.

A battery diagnosing method according to another aspect of the present disclosure may include: a battery information obtaining operation of, by a battery management system LBMS, obtaining battery information including at least one of a temperature, a current and a voltage of a battery; a first diagnosis result generating operation of, by the BMS, generating a first diagnosis result corresponding to a current state of the battery based on the battery information; a second and third diagnosis result generating operation of, by a server, receiving the battery information and the first diagnosis result from the BMS and generating a second diagnosis result corresponding to the current state of the battery and a third diagnosis result corresponding to a future state of the battery from the battery information based on a pre-trained state estimation model; and a battery current state determining operation of, by the server, determining the current state of the battery based on a plurality of diagnosis results for the first diagnosis result, the second diagnosis result, and the third diagnosis result.

A server according to still another aspect of the present disclosure may include: a communication unit; and a processor configured to receive battery information including at least one of a temperature, a current and a voltage of a battery and a first diagnosis result corresponding to a current state of the battery generated based on the battery information from a battery management system (BMS) through the communication unit, generate a second diagnosis result corresponding to the current state of the battery and a third diagnosis result corresponding to a future state of the battery from the battery information based on a pre-trained state estimation model, and determine the current state of the battery based on the first diagnosis result, the second diagnosis result, and the third diagnosis result.

Advantageous Effects

According to one aspect of the present disclosure, there is an advantage in that the current state of the battery can be determined with higher accuracy and reliability based on the diagnosis result for the battery generated by the BMS and the server.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 3 is a diagram for schematically explaining a determination rule corresponding to a diagnosis result according to various embodiments of the present disclosure.

FIG. 4 is a diagram for schematically explaining various determination rules of the present disclosure.

FIG. 6 is a diagram showing a battery diagnosing method according to another embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
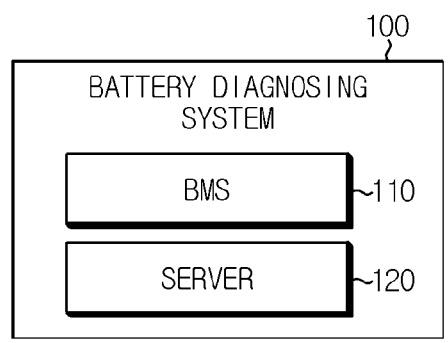
FIG. 1 is a diagram schematically showing a battery diagnosing system according to an embodiment of the present disclosure.
Figure 2:
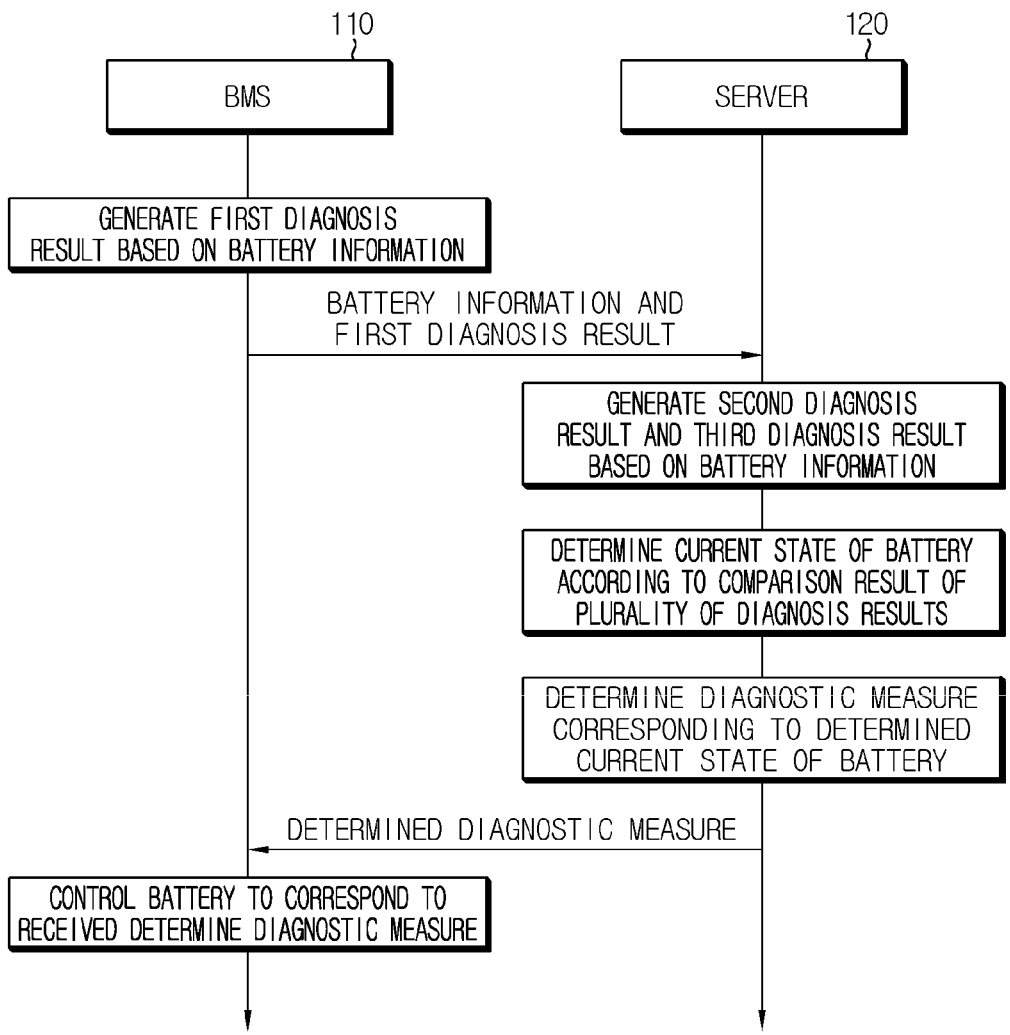
FIG. 2 is a diagram schematically showing an operational configuration of the battery diagnosing system according to an embodiment of the present disclosure.

FIG. 1 is a diagram schematically showing a battery diagnosing system according to an embodiment of the present disclosure. FIG. 2 is a diagram schematically showing an operational configuration of the battery diagnosing system according to an embodiment of the present disclosure.

Referring to FIG. 1, a battery diagnosing system 100 according to an embodiment of the present disclosure may include a battery management system (BMS) 110 and a server 120.

The BMS 110 refers to a battery management system capable of controlling a battery based on battery information (e.g., temperature, voltage, and current). Since the BMS 110 is a configuration commonly used in battery-related fields, a detailed description of the BMS 110 itself is omitted.

The BMS 110 may be configured to obtain battery information including at least one of temperature, current and voltage of the battery.

Here, the battery means one physically separable independent cell including a negative electrode terminal and a positive electrode terminal. For example, one lithium-ion battery or lithium polymer battery may be regarded as a battery. Also, the battery may refer to a battery module in which a plurality of cells are connected in series and/or in parallel. Hereinafter, for convenience of explanation, the battery will be described as meaning one independent cell.

In addition, the BMS 110 may be configured to generate a first diagnosis result corresponding to a current state of the battery based on the battery information.

Specifically, the BMS 110 may generate a first diagnosis result for the battery according to a risk predetermined based on the battery information. For example, the diagnosis result may be configured to be classified into a first level, a second level, and a third level in order of risk for the battery. Here, the risk may be set such that the first level is lowest and the third level is highest.

Preferably, the BMS 110 may have a diagnosis algorithm capable of outputting a first diagnosis result corresponding to the current state of the battery from the battery information. In addition, the BMS 110 may generate a first diagnosis result corresponding to the current state of the battery by inputting the battery information to the diagnosis algorithm.

The diagnosis algorithm may be provided to correspond to the storage capacity and performance of the BMS 110. For example, the diagnostic algorithm may include a training model based on machine learning and/or a relational expression mapped to indicate a corresponding relationship between the battery information and the current state of the battery.

The server 120 may be configured to receive the battery information and the first diagnosis result from the BMS 110.

Specifically, the server 120 and the BMS 110 may be connected to enable communication. The BMS 110 may transmit the obtained battery information and the generated first diagnosis result to the server 120, and the server 120 may receive the battery information and the first diagnosis result. To this end, the server 120 may include a communication unit. For example, the communication unit may communicate with the BMS 110 through a wireless communication method such as Wi-Fi, WFD (Wi-Fi Direct), UWB (Ultra Wideband), or mobile communication. Also, the communication unit may communicate with the BMS 110 through a wired communication method such as a wired LAN (Local Area Network).

The server 120 may be configured to generate a second diagnosis result corresponding to the current state of the battery and a third diagnosis result corresponding to a future state of the battery from the battery information based on a pre-trained state estimation model.

Here, the state estimation model may be a machine learning-based training model configured to estimate and output a diagnosis result corresponding to the current state and the future state of the battery from the battery information. For example, the state estimation model provided in the server 120 may be an XGB (eXtreme Gradient Boosting) model. To this end, the server 120 may include a memory for storing the state estimation model.

Specifically, the server 120 may accumulatively store the battery information previously received from the BMS 110 and train the state estimation model using the accumulatively stored battery information. In addition, the server 120 may further receive battery information for training from the outside or receive battery information from another BMS to train the state estimation model in consideration of all the received battery information. That is, the server 120 may train the state estimation model to output a diagnosis result corresponding to the current state and the future state of the battery from the input battery information by using at least one of the battery information previously received from the BMS 110, the battery information for training received from the outside, and the battery information received from another BMS.

In addition, the state estimation model may not only output a second diagnosis result corresponding to the current state of the battery, but also estimate and output a third diagnosis result corresponding to the future state of the battery. That is, the state estimation model may be configured not only to estimate the current state of the battery but also to predict the future state of the battery. Here, the second diagnosis result and the third diagnosis result may be determined according to a risk predetermined based on the battery information, like the first diagnosis result. For example, the second diagnosis result and the third diagnosis result may be determined as a first level, a second level, or a third level according to risk.

On the other hand, the method of outputting different results (the first diagnosis result corresponding to the current state and the second diagnosis result corresponding to the future state) for the same input (battery information) may be derived by differently setting types or weights of parameters considered according to the trained contents, so it should be noted that specific details of how one state estimation model can output different results (the second diagnosis result and the third diagnosis result) will be omitted. Of course, according to an embodiment, the server 120 may respectively store a first state estimation model that outputs a diagnosis result corresponding to the current state of the battery based on the input battery information and a second state estimation model that outputs a diagnosis result corresponding to the future state of the battery based on the input battery information.

The server 120 may be configured to determine the current state of the battery based on a plurality of diagnosis results for the first diagnosis result, the second diagnosis result, and the third diagnosis result.

Specifically, the server 120 may determine the current state of the battery by considering both the first diagnosis result generated by the BMS 110 and the second diagnosis result and third diagnosis result directly generated.

In general, the server 120 may process a large amount of information compared to the BMS 110. Therefore, the BMS 110 may quickly determine the state of the battery based on real-time battery information, and the server 120 may accurately determine the state of the battery based on the accumulated battery information. In addition, in a general case, since the state of the battery determined by the server 120 is considered to be more accurate than the state of the battery determined by the BMS 110, the server 120 may be regarded as having complementary and supplementary characteristics to the BMS 110.

However, because it is not always possible to judge that the state of the battery determined by the server 120 is more accurate than the state of the battery determined by the BMS 110 due to missing data or an error in the training process, the current state of the battery may be determined considering not only the second diagnosis result and the third diagnosis result directly generated by the server 120 but also the first diagnosis result generated by the BMS 110.

Moreover, since the server 120 determines the current state of the battery by considering not only the first diagnosis result and the second diagnosis result corresponding to the current state of the battery but also the third diagnosis result corresponding to the future state of the battery predicted from the battery information, the possibility of erroneous diagnosis of the state of the battery may be effectively reduced by more conservatively determining the current state of the battery.

Therefore, the battery diagnosing system 100 according to an embodiment of the present disclosure has an advantage of more accurately and reliably determining the current state of the battery based on the diagnosis result of the battery generated by the BMS 110 and the server 120.

Meanwhile, the server 120 may be configured to determine a diagnostic measure for the battery to correspond to the determined current state of the battery.

Here, the diagnostic measure may be a preset battery control measure to correspond to the current state of the battery, that is, the risk to the battery. For example, the diagnostic measure may include at least one of a current blocking measure, a cooling measure, and a fire suppression measure.

The server 120 may be configured to transmit the determined diagnostic measure to the BMS 110.

In addition, the BMS 110 may be configured to control the battery according to the diagnostic measure received from the server 120.

As a specific embodiment, an embodiment in which the battery diagnosing system 100 determines a fire level of the battery and performs diagnosis on the determined fire level will be described.

The server 120 may determine a fire occurrence level based on a plurality of diagnosis results. That is, the server 120 may determine the fire occurrence level of the battery based on the first diagnosis result received from the BMS 110 and the second diagnosis result and the third diagnosis result directly generated.

For example, the fire occurrence level may include a first level corresponding to a normal state, a second level in which the temperature and/or pressure of the battery is increased to a first criterion, a third level in which the temperature and/or pressure of the battery is increased to a second criterion so that a fire is likely to occur, and a fourth level where a fire occurs in the battery.

The server 120 may be configured to determine any one of battery state maintenance, current blocking of the battery, cooling operation of the battery, and fire suppression of the battery as a diagnostic measure corresponding to the determined fire occurrence level.

For example, when the determined fire occurrence level is the first level, since the battery is in a normal state, the server 120 may determine the battery state maintenance as a diagnostic measure. In this case, the battery may not be separately controlled.

As another example, when the determined fire occurrence level is the second level, the server 120 may determine the current blocking of the battery as a diagnostic measure. In this case, although the temperature and/or pressure of the battery is increased to the first criterion, the possibility of a fire is low, so the amount of current flowing into or discharged from the battery may be limited.

As another example, when the determined fire occurrence level is the third level, the server 120 may determine the cooling operation of the battery as a diagnostic measure. In this case, since the temperature and/or pressure of the battery rises to the second criterion and the possibility of fire in the battery increases, a cooling measure for the battery may be performed to lower the temperature of the battery.

As another example, when the determined fire occurrence level is the fourth level, the server 120 may determine fire suppression for the battery as a diagnostic measure. In this case, since a fire has occurred in the battery, a measure for fire suppression may be performed. Here, the fire suppression may be a measure of injecting carbon dioxide or fire extinguisher powder toward the battery.

The server 120 may transmit the diagnostic measure corresponding to the fire occurrence level of the battery to the BMS 110, and the BMS 110 may control the battery to correspond to the received diagnostic measure, thereby performing an appropriate control measure to correspond to the current state of the battery.

Therefore, the battery diagnosing system 100 according to an embodiment of the present disclosure may maintain the battery in a safe state at all times by performing an appropriate diagnostic measure corresponding to the current state of the battery determined based on the plurality of diagnosis results. In addition, since the battery diagnosing system 100 may perform immediate fire suppression even when a fire occurs in the battery, it is possible to prevent a larger accident caused by the fire.

Meanwhile, various operations of the server 120 described above may be performed by a processor of the server 120. Here, the processor may be, for example, a central processing unit (CPU), a micro controller unit (MCU), a digital signal processor (DSP), or a field programmable gate array (FPGA).

Hereinafter, an embodiment in which the server 120 determines the current state of the battery based on the first to third diagnosis results will be described in detail.

The server 120 may be configured to determine the current state according to a comparison result for a plurality of diagnosis results based on a preset battery state determination rule.

Specifically, the server 120 may be configured to judge whether the plurality of diagnosis results are the same and determine the current state of the battery based on the judgment result and the battery state determination rule.

FIG. 3 is a diagram for schematically explaining a determination rule corresponding to a diagnosis result according to various embodiments of the present disclosure. FIG. 4 is a diagram for schematically explaining various determination rules of the present disclosure.

First, the first embodiment will be described among the embodiments of FIG. 3.

When the plurality of diagnosis results are the same, the server 120 may be configured to determine the current state of the battery to correspond to any one of the plurality of diagnosis results.

For example, referring to the first embodiment among the embodiments of FIG. 3, the first to third diagnosis results may all be the same as A. In this case, the server 120 may determine the current state of the battery according to the first determination rule. In addition, the server 120 may determine A as the current state of the battery. That is, referring to FIG. 4, since the first determination rule is to determine any one of the first diagnosis result, the second diagnosis result and the third diagnosis result as the current state of the battery, when the plurality of diagnosis results are all the same, the server 120 may determine the current state of the battery to correspond to any one diagnosis result.

Next, the second embodiment will be described among the embodiments of FIG. 3.

When the first diagnosis result and the second diagnosis result are different and the second diagnosis result and the third diagnosis result are the same, the server 120 may be configured to re-receive the first diagnosis result from the BMS 110 for a predetermined time and determine the current state of the battery based on the re-received first diagnosis result, the second diagnosis result, and the third diagnosis result.

Thereafter, the server 120 may be configured to determine the level with a highest risk among the re-received first diagnosis result, the second diagnosis result, and the third diagnosis result as the current state of the battery.

For example, referring to the second embodiment among the embodiments of FIG. 3, the first diagnosis result may be A, and the second diagnosis result and the third diagnosis result may be B. In this case, the server 120 may determine the current state of the battery according to the second determination rule. The server 120 may re-receive the first diagnosis result from the BMS 110, and determine the current state of the battery again based on the re-received first diagnosis result, the previously generated second diagnosis result and the third diagnosis result.

Next, the third embodiment will be described among the embodiments of FIG. 3.

When the first diagnosis result and the second diagnosis result are the same and the second diagnosis result and the third diagnosis result are different, the server 120 may be configured to determine the level with a highest risk among the plurality of diagnosis results as the current state of the battery.

For example, referring to the third embodiment among the embodiments of FIG. 3, the first diagnosis result and the second diagnosis result may be A, and the third diagnosis result may be B. In this case, the server 120 may determine the current state of the battery according to the third determination rule. The server 120 may determine the diagnosis result with a higher risk among A and B as the current state of the battery.

Next, the fourth embodiment will be described among the embodiments of FIG. 3.

If the first diagnosis result and the third diagnosis result are the same and the third diagnosis result and the second diagnosis result are different, the server 120 may be configured to retrain the state estimation model based on the accumulatively stored battery information, regenerate the second diagnosis result and the third diagnosis result for the battery by using the retrained state estimation model, and diagnose the current state of the battery based on the first diagnosis result, the regenerated second diagnosis result, and the regenerated third diagnosis result.

For example, referring to the fourth embodiment among the embodiments of FIG. 3, the first diagnosis result and the third diagnosis result may be A, and the second diagnosis result may be B. In this case, the server 120 may determine the current state of the battery according to the fourth to sixth determination rules. The server 120 may retrain the state estimation model and regenerate a second diagnosis result and a third diagnosis result by using the retrained state estimation model. In addition, the server 120 may diagnose the current state of the battery again according to the first diagnosis result received from the BMS 110, the regenerated second diagnosis result, and the third diagnosis result.

Finally, the fifth embodiment will be described among the embodiments of FIG. 3.

When the plurality of diagnosis results are all different, the server 120 may be configured to retrain the state estimation model based on the accumulatively stored battery information, regenerate the second diagnosis result and the third diagnosis result for the battery by using the retrained state estimation model, and diagnose the current state of the battery based on the first diagnosis result, the regenerated second diagnosis result and the regenerated third diagnosis result.

For example, referring to the fifth embodiment among the embodiments of FIG. 3, the first diagnosis result may be A, the second diagnosis result may be B, and the third diagnosis result may be C. In this case, the server 120 may determine the current state of the battery according to the fourth to sixth determination rules. The server 120 may retrain the state estimation model and regenerate the second diagnosis result and the third diagnosis result by using the retrained state estimation model. In addition, the server 120 may diagnose the current state of the battery again according to the first diagnosis result received from the BMS 110, the regenerated second diagnosis result, and the third diagnosis result.

That is, in the fourth and fifth embodiments of FIG. 3, the server 120 may determine the current state of the battery according to the fourth to sixth determination rules.

First, according to the fourth determination rule, the server 120 may retrain the state estimation model based on the accumulatively stored battery information, and regenerate the second diagnosis result and the third diagnosis result based on the retrained state estimation model. In addition, the server 120 may determine the current state of the battery by applying the first to third determination rules to the first diagnosis result, the regenerated second diagnosis result, and the regenerated third diagnosis result. For example, if the first diagnosis result, the regenerated second diagnosis result, and the regenerated third diagnosis result correspond to the first to third embodiments of FIG. 3, the server 120 may determine the current state of the battery according to the first to third determination rules.

If the first diagnosis result, the regenerated second diagnosis result, and the regenerated third diagnosis result correspond to the fourth embodiment of FIG. 3, the server 120 may output a notification without determining the current state of the battery according to the fifth determination rule. That is, when the first diagnosis result and the regenerated third diagnosis result are the same and the regenerated second diagnosis result and the regenerated third diagnosis result are different, the server 120 may be configured to output a notification for an error of the state estimation model without determining the current state of the battery according to the fifth determination rule.

If the first diagnosis result, the regenerated second diagnosis result, and the regenerated third diagnosis result correspond to the fifth embodiment of FIG. 3, the server 120 may determine the current state of the battery according to the sixth determination rule. That is, when the first diagnosis result, the regenerated second diagnosis result, and the regenerated third diagnosis result are all different, the server 120 may retrain the state estimation model according to the sixth determination rule. In addition, the server 120 may regenerate the second diagnosis result and the third diagnosis result based on the retrained state estimation model. The server 120 may determine the current state of the battery based on the first diagnosis result, the regenerated second diagnosis result, and the regenerated third diagnosis result. Here, the server 120 may determine an embodiment corresponding to the first diagnosis result, the regenerated second diagnosis result, and the regenerated third diagnosis result among the first to fifth embodiments of FIG. 3 and determine the current state of the battery according to the determined embodiment.

The BMS 110 according to the present disclosure may be provided in a battery pack. That is, the battery pack according to the present disclosure may include the aforementioned BMS 110 and one or more battery cells. In addition, the battery pack may further include electrical components (relays, fuses, etc.) and a case.

Figure 5:
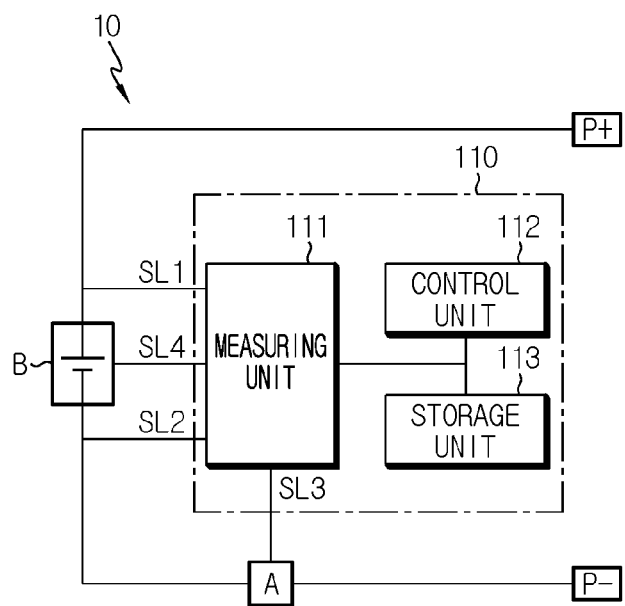
FIG. 5 is a diagram showing an exemplary configuration of a battery pack that may include a BMS according to an embodiment of the present disclosure.

FIG. 5 is a diagram showing an exemplary configuration of a battery pack that may include the BMS 110 according to an embodiment of the present disclosure.

The positive electrode terminal of the battery B may be connected to a positive electrode terminal P+ of the battery pack 1, and the negative electrode terminal of the battery B may be connected to a negative electrode terminal P− of the battery pack 1.

The measuring unit 111 may be connected to a first sensing line SL1, a second sensing line SL2, a third sensing line SL3, and a fourth sensing line SL4.

Specifically, the measuring unit 111 may be connected to the positive electrode terminal of the battery B through the first sensing line SL1 and connected to the negative electrode terminal of the battery B through the second sensing line SL2. The measuring unit 111 may measure the voltage of the battery B based on the voltages respectively measured at the first sensing line SL1 and the second sensing line SL2.

Also, the measuring unit 111 may be connected to a current measuring unit A through the third sensing line SL3. For example, the current measuring unit A may be an ampere meter or a shunt resistor capable of measuring a charging current and a discharging current of the battery B. The measuring unit 111 may calculate a charge amount by measuring the charging current of the battery B through the third sensing line SL3. In addition, the measuring unit 111 may calculate a discharge amount by measuring the discharge current of the battery B through the third sensing line SL3.

Also, the measuring unit 111 may measure the temperature of the battery B through the fourth sensing line SL4.

The voltage, current, and temperature of the battery B measured by the measuring unit 111 may be transmitted to a control unit 112 and a storage unit 113.

The control unit 112 may generate the first diagnosis result corresponding to the current state of the battery B based on the battery information received from the measuring unit 111. In addition, the control unit 112 may transmit the generated first diagnosis result to the server 120. Also, the control unit 112 may receive a diagnostic measure corresponding to the battery B from the server 120, and limit the amount of current of the battery B or perform cooling or fire suppression for the battery B to correspond to the received diagnostic measure.

Meanwhile, the control unit provided to the BMS 110 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit may be implemented as a set of program modules. At this time, the program module may be stored in a memory and executed by the control unit. The memory may be located inside or out of the control unit and may be connected to the control unit by various well-known means.

That is, the BMS 110 may further include a storage unit. The storage unit may store data necessary for operation and function of each component of the BMS 110, data generated in the process of performing the operation or function, or the like. The storage unit is not particularly limited in its kind as long as it is a known information storage means that can record, erase, update and read data. As an example, the information storage means may include RAM, flash memory, ROM, EEPROM, registers, and the like. In addition, the storage unit may store program codes in which processes executable by the control unit are defined.

FIG. 6 is a diagram showing a battery diagnosing method according to another embodiment of the present disclosure.

Preferably, each step of the battery diagnosing method may be performed by the battery management apparatus 100. Hereinafter, for convenience of explanation, contents overlapping with the previously described contents will be omitted or briefly described.

Referring to FIG. 6, the battery diagnosing method may include a battery information obtaining step, a first diagnosis result generating step, a second and third diagnosis result generating step, and a battery current state determining step.

The battery information obtaining step (S100) is a step of obtaining battery information including at least one of temperature, current, and voltage of a battery, and may be performed by the BMS 110.

The first diagnosis result generating step (S200) is a step of generating a first diagnosis result corresponding to a current state of the battery based on the battery information, and may be performed by the BMS 110.

For example, the BMS 110 may generate a first diagnosis result corresponding to the current state of the battery by inputting the battery information to a provided diagnosis algorithm.

The second and third diagnosis result generating step (S300) is a step of receiving the battery information and the first diagnosis result from the BMS 110 and generating a second diagnosis result corresponding to the current state of the battery and a third diagnosis result corresponding to a future state of the battery from the battery information based on a pre-trained state estimation model, and may be performed by the server 120.

For example, the server 120 may generate a second diagnosis result corresponding to the current state of the battery and a third diagnosis result corresponding to the future state of the battery by inputting the battery information to the pre-trained state estimation model.

The battery current state determining step (S400) is a step of determining the current state of the battery based on a plurality of diagnosis results for the first diagnosis result, the second diagnosis result, and the third diagnosis result, and may be performed by the server 120.

For example, referring to FIGS. 3 and 4, the server 120 may determine the current state of the battery based on a determination rule corresponding to the first diagnosis result, the second diagnosis result, and the third diagnosis result.

Also, referring to FIG. 6, the battery diagnosing method may further include a diagnostic measure determining step (S500) and a battery controlling step (S600).

The diagnostic measure determining step (S500) is a step of determining a diagnostic measure for the battery to correspond to the determined current state of the battery, and may be performed by the server 120.

For example, a plurality of diagnostic measures may be set according to the risk of the battery, and the server 120 may determine a diagnostic measure corresponding to the current state of the battery. The diagnostic measure may include at least one of a current blocking measure, a cooling measure, and a fire suppression measure.

The battery controlling step (S600) is a step of controlling the battery according to the diagnostic measure determined in the diagnostic measure determining step (S500), and may be performed by the BMS 110.

First, the BMS 110 may receive the determined diagnostic measure from the server 120. In addition, the BMS 110 may control the battery according to the diagnostic measure determined by the server 120.

For example, the BMS 110 may maintain the state of the battery or block the current of the battery according to the current state of the battery. In addition, the BMS 110 may perform a cooling measure or a fire suppression measure according to the current state of the battery.

According to an embodiment of the present disclosure, since an appropriate diagnostic measure corresponding to the current state of the battery determined based on a plurality of diagnosis results is performed, the battery may always be maintained in a safe state. In addition, even if a fire occurs in the battery, immediate fire suppression may be performed, so it is possible to prevent a larger accident from occurring due to the fire.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery pack
100: battery diagnosing system
110: BMS
111: measuring unit
112: control unit
113: storage unit
120: server

What is claimed is:

1. A battery diagnosing system, comprising:
 a battery management system (BMS) configured to:
 obtain battery information including at least one of a temperature, a current and a voltage of a battery, and
 generate a first diagnosis result corresponding to a current state of the battery based on the battery information; and
 a server configured to:
 receive the battery information and the first diagnosis result from the BMS,
 generate a second diagnosis result corresponding to the current state of the battery and a third diagnosis result corresponding to a future state of the battery from the battery information based on a state estimation model, which is pre-trained,
 determine the current state of the battery based on a plurality of diagnosis results of the first diagnosis result, the second diagnosis result, and the third diagnosis result, and
 perform a control measure based on whether the first diagnosis result, the second diagnosis result and the third diagnosis result are same or different with one another.

2. The battery diagnosing system according to claim 1, wherein the plurality of diagnosis results are configured to be classified into a first level, a second level, and a third level in order of risk for the battery, and
 wherein the server is configured to determine the current state of the battery according to a comparison result for the plurality of diagnosis results based on a preset battery state determination rule.

3. The battery diagnosing system according to claim 1, wherein the server is configured to determine a diagnostic measure for the battery to correspond to the determined current state of the battery and transmit the determined diagnostic measure to the BMS, and
 wherein the BMS is configured to control the battery according to the diagnostic measure received from the server.

4. The battery diagnosing system according to claim 2, wherein the server is configured to judge whether the plurality of diagnosis results are the same and determine the current state of the battery based on a judgment result and the preset battery state determination rule.

5. The battery diagnosing system according to claim 2, wherein, when the plurality of diagnosis results are the same, the server is configured to determine the current state of the battery to correspond to any one of the plurality of diagnosis results.

6. The battery diagnosing system according to claim 2, wherein, when the first diagnosis result and the second diagnosis result are different and the second diagnosis result and the third diagnosis result are the same, the server is configured to perform the control measure to re-receive the first diagnosis result from the BMS for a predetermined time and determine the current state of the battery based on the re-received first diagnosis result, the second diagnosis result, and the third diagnosis result.

7. The battery diagnosing system according to claim 2, wherein, when the first diagnosis result and the second diagnosis result are the same and the second diagnosis result and the third diagnosis result are different, the server is configured to perform the control measure to determine the level with a highest risk among the plurality of diagnosis results as the current state of the battery.

8. The battery diagnosing system according to claim 2, wherein, when the first diagnosis result and the third diagnosis result are the same and the third diagnosis result and the second diagnosis result are different, and when the plurality of diagnosis results are all different, the server is configured to perform the control measure to:
 retrain the state estimation model based on the battery information received from the BMS and accumulatively stored, regenerate the second diagnosis result and the third diagnosis result for the battery using the retrained state estimation model, and diagnose the current state of the battery based on the first diagnosis result, the regenerated second diagnosis result, and the regenerated third diagnosis result.

9. The battery diagnosing system according to claim 6, wherein the server is configured to determine the level with a highest risk among the re-received first diagnosis result, the second diagnosis result, and the third diagnosis result as the current state of the battery.

10. The battery diagnosing system according to claim 8, wherein, when the first diagnosis result and the regenerated second diagnosis result are the same and the regenerated third diagnosis result and the regenerated second diagnosis result are different, the server is configured perform the control measure not to determine the current state of the battery and to output a notification that an error occurs in the state estimation model.

11. The battery diagnosing system according to claim 8, wherein, when the first diagnosis result, the regenerated second diagnosis result, and the regenerated third diagnosis result are all different, the server is configured to perform the control measure to retrain the state estimation model.

12. The battery diagnosing system according to claim 3, wherein the server is configured to:
determine a fire occurrence level as the state current state of the battery based on the plurality of diagnosis results, and
determine any one of current blocking of the battery, cooling operation for the battery, and fire suppression for the battery as a diagnostic measure corresponding to the determined fire occurrence level.

13. A battery diagnosing method, comprising:
a battery information obtaining operation of, by a battery management system (BMS), obtaining battery information including at least one of a temperature, a current and a voltage of a battery;
a first diagnosis result generating operation of, by the BMS, generating a first diagnosis result corresponding to a current state of the battery based on the battery information;
a second and third diagnosis result generating operation of, by a server, receiving the battery information and the first diagnosis result from the BMS and generating a second diagnosis result corresponding to the current state of the battery and a third diagnosis result corresponding to a future state of the battery from the battery information based on a pre-trained state estimation model;
a battery current state determining operation of, by the server, determining the current state of the battery based on a plurality of diagnosis results for the first diagnosis result, the second diagnosis result, and the third diagnosis result; and
a control measure performing operation of, by the server, performing a control measure based on whether the first diagnosis result, the second diagnosis result and the third diagnosis result are same or different with one another.

14. The battery diagnosing method according to claim 13, comprising:
a diagnosis measure determining operation of, by the server, determining a diagnostic measure for the battery that corresponds to the current state of the battery; and
a battery controlling operation of, by the BMS, controlling the battery according to the diagnostic measure, wherein the diagnostic measure includes at least one of a current blocking measure, a cooling measure, and a fire suppression measure for the BMS to use to control the battery in accordance with the diagnostic measure.

15. The battery diagnosing method according to claim 13, wherein the first, second and third diagnosis results are configured to be classified into a first level, a second level, and a third level in order of risk for the battery, and
wherein the battery diagnosing method further comprises, determining, by the server, the current state of the battery according to a comparison result for the first, second and third diagnosis results based on a preset battery state determination rule.

16. The battery diagnosing method according to claim 13, wherein, when the first, second and third diagnosis results are the same, the control measure performing operation includes determining, by the server, the current state of the battery to correspond to any one of first, second and third diagnosis results, and
wherein, when any of the first, second and third diagnosis results are different from one another, the control measure performing operation includes re-receiving, by the server, the first diagnosis result from the BMS for a predetermined time and determining the current state of the battery based on the re-received first diagnosis result, the second diagnosis result, and the third diagnosis result.

17. A server, comprising:
a communication unit; and
a processor configured to:
receive battery information including at least one of a temperature, a current and a voltage of a battery and a first diagnosis result corresponding to a current state of the battery generated based on the battery information from a battery management system (BMS) through the communication unit,
generate a second diagnosis result corresponding to the current state of the battery and a third diagnosis result corresponding to a future state of the battery from the battery information based on a pre-trained state estimation model,
determine the current state of the battery based on the first diagnosis result, the second diagnosis result, and the third diagnosis result, and
perform a control measure based on whether the first diagnosis result, the second diagnosis result and the third diagnosis result are same or different to one another.

18. The server according to claim 17, wherein the processor is further configured to determine a diagnostic measure for the battery to correspond to the current state of the battery, and transmit the diagnostic measure to the BMS through the communication unit, and
wherein the diagnostic measure includes at least one of a current blocking measure, a cooling measure, and a fire suppression measure for the BMS to use to control the battery according to the diagnostic measure.

19. The server according to claim 17, wherein the first, second and third diagnosis results are configured to be classified into a first level, a second level, and a third level in order of risk for the battery, and
wherein the server is configured to determine the current state of the battery according to a comparison result for the first, second and third diagnosis results based on a preset battery state determination rule.

20. The server according to claim 17, wherein, when the first, second and third diagnosis results are the same, the server is configured to perform the control measure to determine the current state of the battery to correspond to any one of first, second and third diagnosis results, and wherein, when any of the first, second and third diagnosis results are different from one another, the server is configured to perform the control measure to re-receive the first diagnosis result from the BMS for a predetermined time and determine the current state of the battery based on the re-received first diagnosis result, the second diagnosis result, and the third diagnosis result.

* * * * *